(12) United States Patent
Lee

(10) Patent No.: US 7,280,430 B2
(45) Date of Patent: Oct. 9, 2007

(54) SEMICONDUCTOR MEMORY DEVICE

(75) Inventor: Chang-Hyuk Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/321,876

(22) Filed: Dec. 30, 2005

(65) Prior Publication Data
US 2006/0245277 A1 Nov. 2, 2006

(30) Foreign Application Priority Data
Apr. 30, 2005 (KR) .................... 10-2005-0036594

(51) Int. Cl.
*G11C 8/00* (2006.01)
(52) U.S. Cl. ..................... 365/233; 365/194
(58) Field of Classification Search ............... 365/194, 365/233
See application file for complete search history.

(56) References Cited

U.S. PATENT DOCUMENTS

| | | | |
|---|---|---|---|
| 6,031,787 A | 2/2000 | Jeddeloh | |
| 6,185,664 B1 | 2/2001 | Jeddeloh | |
| 6,546,476 B1 | 4/2003 | Gillingham | |
| 6,914,850 B2 | 7/2005 | Chai | |
| 2003/0221044 A1 | 11/2003 | Nishio et al. | |
| 2006/0161745 A1* | 7/2006 | Lee et al. ................ | 711/154 |
| 2006/0250883 A1* | 11/2006 | Szczypinski ............. | 365/233 |
| 2007/0008809 A1* | 1/2007 | Kim ....................... | 365/233 |

FOREIGN PATENT DOCUMENTS

| | | |
|---|---|---|
| JP | 2003-337742 | 11/2003 |
| JP | 2004-253123 | 9/2004 |
| KR | 1020050035637 | 4/2005 |

* cited by examiner

*Primary Examiner*—Michael T Tran
(74) *Attorney, Agent, or Firm*—McDermott Will & Emery LLP

(57) ABSTRACT

Disclosed herein is a semiconductor memory device for reducing an unnecessary current consumption occurred in an idle state or an active state. The semiconductor memory device includes a driving clock supply unit for supplying a driving clock during a read or a write operation of each bank; a delay unit for generating a read address or a write address in synchronization with the driving clock by delaying an address by a predetermined time based on one of an additive latency, a CAS latency and a combination thereof; and an output unit for latching the read address or the write address to output the latched signal as an internal column address.

30 Claims, 13 Drawing Sheets

SEMICONDUCTOR MEMORY DEVICE

FIELD OF THE INVENTION

The present invention relates to a semiconductor memory device; and, more particularly, to a semiconductor memory device for reducing an unnecessary current consumption occurred in an idle state or an active state.

DESCRIPTION OF RELATED ART

Generally, to access a predetermined cell in a semiconductor memory device, an operation to select a wordline and a bitline connected to the specific cell is required. Also, to select the wordline and the bitline, a command and an address relating to the predetermined cell are inputted. The semiconductor memory device performs an operation corresponding to the command and the address of the predetermined cell for a predetermined time.

For example, it is assumed that a row active command and a row address for activating the wordline are loaded to the semiconductor memory device. After a row address strobe (Hereinafter, referred to a RAS) to column address strobe (Hereinafter, referred to a CAS) delay time tRCD, a column address and a read or a write command for activating the bitline can be loaded to the semiconductor memory device.

In the mean time, in a double data rate II synchronous dynamic random access memory (Hereinafter, referred to a DDR II SDRAM), an additive latency is determined by an extended mode resister set (EMRS) so as to control a point of loading the read command or the write command.

Namely, in the DDR II SDRAM, even before the RAS to CAS delay time tRCD from the row active command, the read command or the write command can be loaded to the semiconductor memory device according to the additive latency.

In detail, it is assumed that the RAS to CAS delay time tRCD is set to three clocks. If the additive latency is set as two clocks, the read command or the write command can be load to the semiconductor memory device after one clock from the row active command being loaded. On the other hand, if the additive latency is set to be zero, the read command or the write command can be load to the semiconductor memory device three clocks later, i.e., the RAS to CAS delay time tRCD, from the row active command being loaded.

The reason why the read or the write command is inputted earlier before the RAS to CAS delay time tRCD is that the read command or the write command loaded to the DDR II SDRAM is not used immediately but decoded to generate internal control signals which substantially performs a read or a write operation in the semiconductor memory device.

Namely, the read command is internally generated as a read CAS signal and the write command is internally generated as a write CAS signal. The read CAS signal is internally activated after a predetermined delay from a time of loading the read command, i.e., corresponding to the additive latency. The write CAS signal is internally activated after a predetermined delay from a time of loading the write command being loaded, i.e., corresponding to a write latency (AL+CL+1).

Likewise, the column address inputted with the read command or the write command is loaded after has an identical delay same with the read command or the write command.

A conventional process to generate an internal column address is described in FIG. 1.

FIG. 1 is a block diagram showing a column address shift unit in a conventional semiconductor memory device.

As shown, the semiconductor memory device includes address shift units 10 to 16 are classified into an address bit. The address shift units 10 to 16 delay an internal address BUF_OUT<0:3> for an additive latency or a CAS latency in synchronization with a read CAS signal CASP6_RD or a write CAS signal CASP6_WT to thereby output an internal column address AT_COL<0:3>. Herein, the internal address BUF_OUT<0:3> can be generated from an address buffer by converting an external address into an internal voltage level in synchronization with an internal clock CLKP4.

FIG. 2 is a detailed block diagram depicting the column address shift unit of FIG. 1.

As shown, the conventional column address shift includes a read address generating unit 20, a write address generating unit 30, an address output unit 40 and a write section clock supply unit 50.

The read address generating unit 20 generates an AL address RA_OUT by delaying the internal address BUF_OUT for a predetermined time corresponding to the additive latency in response to a CAS signal CASP6 and generates a read address by synchronizing the AL address RA_OUT with the read CAS signal CASP6_RD.

In detail, the read address generating unit 20 includes a first transfer gate TG1, a read latch unit 22, a read delay unit 24, an AL select unit and a second transfer gate TG2.

The first transfer gate TG1 transfers the internal address BUF_OUT to the read latch 22 in response to the CAS signal CASP6. The read latch unit 22 latches an output of the first transfer gate TG1. The read delay unit 24 delays an output of the read latch unit 22 to generate a first pre-AL address AL1_ADD and a second pre-AL address AL2_ADD. The AL select unit 26 selects one of the internal address BUF_OUT, the first pre-AL address AL1_ADD and the second pre-AL address AL2_ADD in response to an AL information signal AL<0:2> to thereby output the AL address RA_OUT. The second transfer gate TG2 outputs the read address by transferring the AL address RA_OUT in response to the CAS read signal CASP6_RD.

The read delay unit 24 of the read address generating unit 20 includes a first read flip-flop 24a and a second read flip-flop 24b provided in series. The first read flip-flop 24a outputs the first pre-AL address AL1_ADD by synchronizing the output of the read latch unit 22 with the internal clock CLKP4. The second read flip-flop 24b outputs the second pre-AL address AL2_ADD by synchronizing an output of the first read flip-flop 24a with the internal clock CLKP4. Hence, the second pre-AL address AL2_ADD is outputted later than the first pre-AL address AL1_ADD by one clock.

The write address generating unit 30 generates a CL address WA_OUT by delaying the AL address RA_OUT for a predetermined time corresponding to the CAS latency in response to a write section clock CLK and generates a write address by synchronizing the AL address RA_OUT with the write CAS signal CASP6_WT.

In detail, the write address generating unit 30 includes a write delay unit 32, a CL select unit 34 and a third transfer gate TG3.

The write delay unit 32 delays the AL address RA_OUT for the CAS latency to thereby output a first pre-CL address CL3_ADD and a second pre-CL address CL4_ADD in response to the write section clock CLK. The CL select unit 34 selects one of the first pre-CL address CL3_ADD and the second pre-CL address CL4_ADD in response to a CL information signal CL<3:4> to thereby output the CL address WA_OUT. The third transfer gate TG3 outputs the write address by transferring the CL address WA_OUT in response to the CAS write signal CASP6_WT.

The write delay unit 32 of the write address generating unit 30 includes a first write flip-flop 32a to a fifth write flip-flop 32e, provided in series, to generate the first pre-CL address CL3_ADD and the second pre-CL address CL4_ADD by synchronizing the AL address RA_OUT with the write section clock CLK. Hence, a fourth flip-flop 32d outputs the first pre-CL address CL3_ADD by delaying the AL address RA_OUT for three clocks and the fifth flip-flop 32e outputs the second pre-CL address CL4_ADD by delaying an output of the fourth flip-flop 32d for one clock.

The address output unit 40 latches the read address or the write address to output the internal column address AT_COL.

The write section clock supply unit 50 supplies the write section clock CLK for the write address generating unit 30 in response to an internal write signal WTP6 until an internal read signal RDP6 is loaded.

In detail, the write section clock supply unit 50 includes a write section detect unit 52 and a clock output unit 54.

The write section detect unit 52 receives the internal write signal WTP6 and the internal read signal RDP6 to generate a write section signal WT_ADDEN. The clock output unit 54 generates the write section clock CLK by using the internal clock CLKP4 only when the write section signal WT_ADDEN is activated. The clock output unit 54 includes a NAND gate ND1 and an inverter I1. The NAND gate ND1 receives the write section signal WT_ADDEN and the internal clock CLKP4. The inverter I1 inverts an output of the NAND gate ND1 to output the write section clock CLK.

For reference, the CAS signal CASP6 is internally generated when a read command or a write command, which occurs an operation related with column in the semiconductor memory device, is inputted. The read CAS signal CASP6_RD is generated by delaying the CAS signal CASP6 for the additive latency and the write CAS signal CASP6_WT is generated by delaying the CAS signal CASP6 for a write latency. In addition, the AL information signal AL<0:2> has an information about the additive latency within an EMRS and the CL information signal CL<3:4> has an information about the (CAS latency+1).

FIG. 3 is a schematic circuit diagram depicting the write section detect unit 52 in the column address shift unit of FIG. 2.

As shown, the write section detect unit 52 includes a first PMOS transistor PM1, a second PMOS transistor PM2, a first NMOS transistor NM1 and a write latch unit 52a.

The first PMOS transistor PM1 has a gate receiving the internal read signal RDP6 and a source connected to a first internal voltage VDD supply. The first NMOS transistor NM1 has a gate receiving the internal write signal WTP6, a drain connected to a drain of the first PMOS transistor PM1 and a source connected to a second internal voltage VSS supply. The second PMOS transistor PM2 has a gate receiving a power-up signal PWRUP, a drain connected to the drain of the first PMOS transistor PM1 and a source connected to the first internal voltage VDD supply. The write latch unit 52a is for outputting the write section signal WT_ADDEN by latching a signal supplied at the drain of the second PMOS transistor PM2.

The write section detect unit 52 activates the write section signal WT_ADDEN as a logic level 'HIGH' in response to the internal write signal WTP6 and deactivates the write section signal WT_ADDEN as a logic level 'LOW' in response to the internal read signal RDP6. Namely, in case when the internal write signal WTP6 is activated, the write section signal WT_ADDEN is activated until the internal read signal RDP6 is loaded.

In addition, in case that the internal voltage level is not stabilized at an initial operation of the semiconductor memory device, the write section detect unit 52 initializes the write section signal WT_ADDEN as the logic level 'HIGH' in response to the power-up signal PWRUP deactivated as a logic level 'LOW'.

According to FIGS. 2 and 3, a conventional process to generate the internal column address AT_COL by delaying the external address for the additive latency or the write latency is described in FIG. 4.

FIG. 4 is a timing diagram illustrating a process to generate the internal column address AT_COL during a read operation of the conventional semiconductor memory device. Herein, the additive latency is two clocks.

To begin with, the external address is loaded together with the read command RD. The CAS signal CASP6 is activated by the read command RD and the internal address BUF_OUT has an effective address information.

The read address generating unit 20 receives the internal address BUF_OUT through the first transfer gate TG1 activated by the CAS signal CASP6.

The read latch unit 22 latches an output of the first transfer gate TG1. Then, the first read flip-flop 24a of the read delay unit 24 outputs the first pre-AL address AL1_ADD by synchronizing the output of the read latch unit 22 with the internal clock CLKP4, and the second read flip-flop 24b outputs the second pre-AL address AL2_ADD by synchronizing an output of the first read flip-flop 24a with the next internal clock CLKP4. Hence, the second pre-AL address AL2_ADD is later than the first pre-AL address AL1_ADD by one clock.

The AL select unit 26 selects the second pre-AL address AL2_ADD having the additive latency two clocks according to the AL information signal AL<0:2> and outputs the AL address RA_OUT. The AL address RA_OUT is outputted as the read address through the second transfer gate TG2 activated by the CAS read signal CASP6_RD.

Finally, the address output unit 40 latches the read address to output the internal column address AT_COL.

As shown in FIG. 4, the external address inputted together with the read command RD is outputted as the internal column address AT_COL in a time of 'a', i.e., after the additive latency two clocks. The internal column address AT_COL is maintained until the other read command or the write command is inputted.

FIG. 5 is a timing diagram illustrating a process to generate the internal column address AT_COL during a write operation of the conventional semiconductor memory device. Herein, the additive latency is two clocks and the CAS latency is three clocks.

To begin with, the external address is loaded together with the write command WT. So, the CAS signal CASP6 is activated by the write command WT and the internal address BUF_OUT has the effective address information.

The read address generating unit 20 receives the internal address BUF_OUT by the activated CAS signal CASP6 to output the AL address RA_OUT having a two-clock delay corresponding to the additive latency, i.e., in point of 'b'.

The first write flip-flop 32a to the fifth write flip-flop 32e in the write address generating unit 30 output the first pre-CL address CL3_ADD and the second pre-CL address CL4_ADD by synchronizing the AL address RA_OUT with the write section clock CLK. Hence, the first pre-CL address CL3_ADD is outputted by delaying the AL address RA_OUT by three clocks and the second pre-CL address CL4_ADD is outputted by delaying the AL address RA_OUT by four clocks.

The CL select unit 34 selects the second pre-CL address AL4_ADD having four clocks as the (CAS latency+1), i.e., in point of 'c' according to the CL information signal CL<3:4> and outputs the CL address WA_OUT. The CL address WA_OUT is outputted as the write address through the third transfer gate TG3 activated by the CAS write signal CASP6_WT.

Herein, the write section clock CLK is generated by the write section clock supply unit 50 according to the internal write signal WTP6 which is activated when the write command WT is inputted. The write section clock CLK is maintained until new read command is inputted so that the internal read signal RDP6 is activated.

Finally, the address output unit 40 latches the write address to output the internal column address AT_COL.

In the conventional semiconductor memory device, because of generating the internal column address, a problem that an unnecessary current consumption in an idle state or an active state of bank is occurred has arisen.

The current consumption is occurred by a plurality of flip-flops within the read address generating unit 20 to delay the external address by the predetermined time corresponding to the additive latency, and a plurality of flip-flops within the write address generating unit 30 to delay the AL address by the predetermined time corresponding to the CAS latency.

In detail, the flip-flops within the read address generating unit 20 are continuously operated regardless of which the read command or the write command is inputted. The flip-flops within the write address generating unit 30 are continuously operated by the only write command until the read command is inputted.

For example, when the semiconductor memory device operates at 400 MHz, a large amount of the current is consumed by the flip-flops in the read address generating unit 20 and the write address generating unit 30 to generate one bit column address in the idle state or the active state of bank is about 400 uA. The semiconductor memory device receives 16-bit column address; as a result, an unnecessary current, about 6.4 mA, is consumed in the idle state or the active state of bank.

SUMMARY OF THE INVENTION

It is, therefore, an object of the present invention to provide a semiconductor memory device for reducing an unnecessary current consumption occurred in an idle state or an active state.

In accordance with an aspect of the present invention, there is provided a semiconductor memory device for reducing an unnecessary current consumption, including a driving clock supply unit for supplying a driving clock during a read or a write operation of each bank; a delay unit for generating a read address or a write address in synchronization with the driving clock by delaying an address by a predetermined time based on one of an additive latency, a CAS latency and a combination thereof; and an output unit for latching the read address or the write address to output the latched signal as an internal column address.

In accordance with another aspect of the present invention, there is provided a semiconductor memory device for reducing an unnecessary current consumption, including a first driving clock supply unit for supplying a first driving clock during a read or a write operation of each bank; a second driving clock supply unit for supplying a second driving clock during the write operation of each bank; a read address generating unit for generating an AL address in synchronization with the first driving clock by delaying an address inputted in response to a CAS signal by an additive latency to thereby output a read address according to a read CAS signal; a write address generating unit for generating a CL address in synchronization with the second driving clock by delaying the AL address by a CAS latency to thereby output a write address according to a write CAS signal; and an address output unit for latching the read address or the write address to output the latched signal as an internal column address.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Hereinafter, a semiconductor memory device in accordance with the present invention will be described in detail referring to the accompanying drawings.

Figure 1:
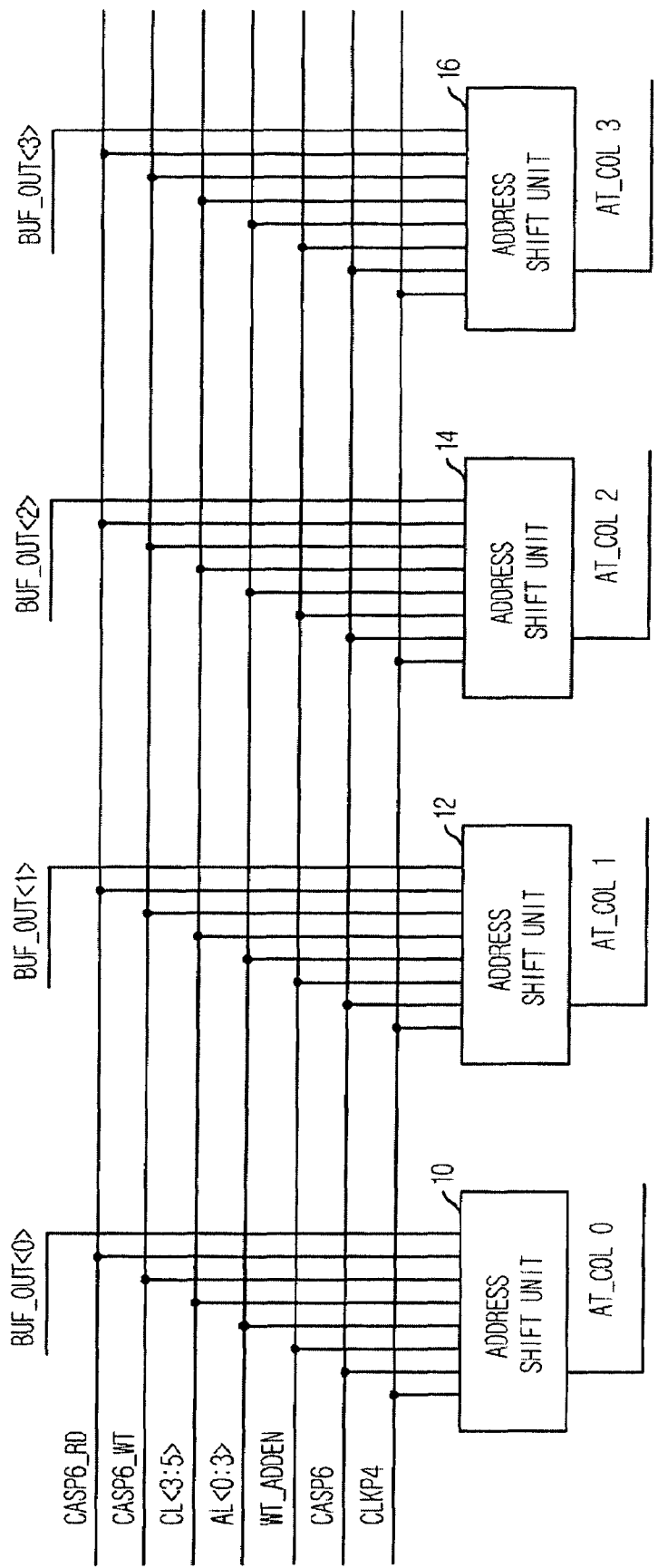
FIG. 1 is a block diagram showing a column address shift unit in a conventional semiconductor memory device.
Figure 2:
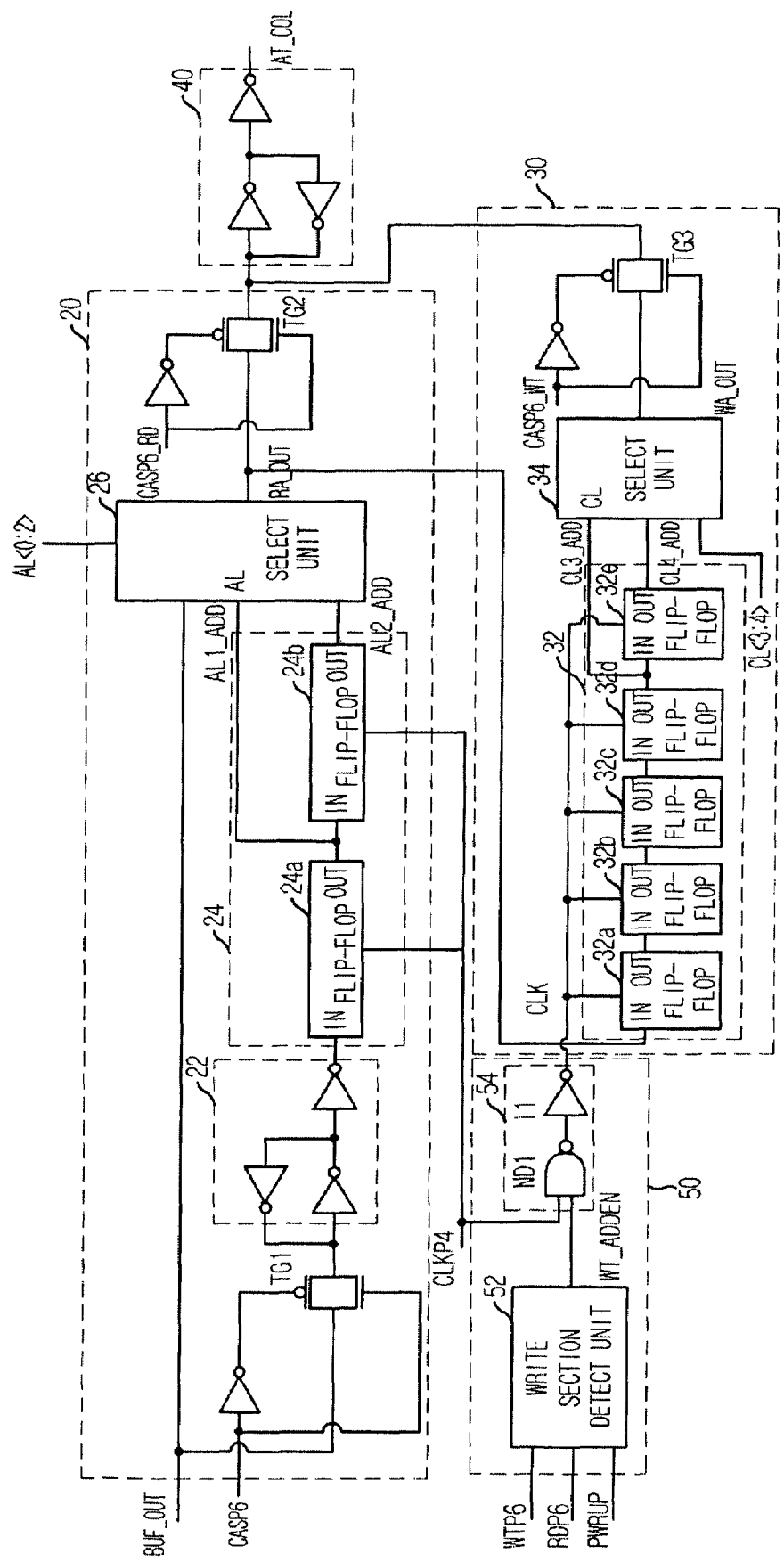
FIG. 2 is a detailed block diagram depicting the column address shift unit of FIG. 1.
Figure 3:
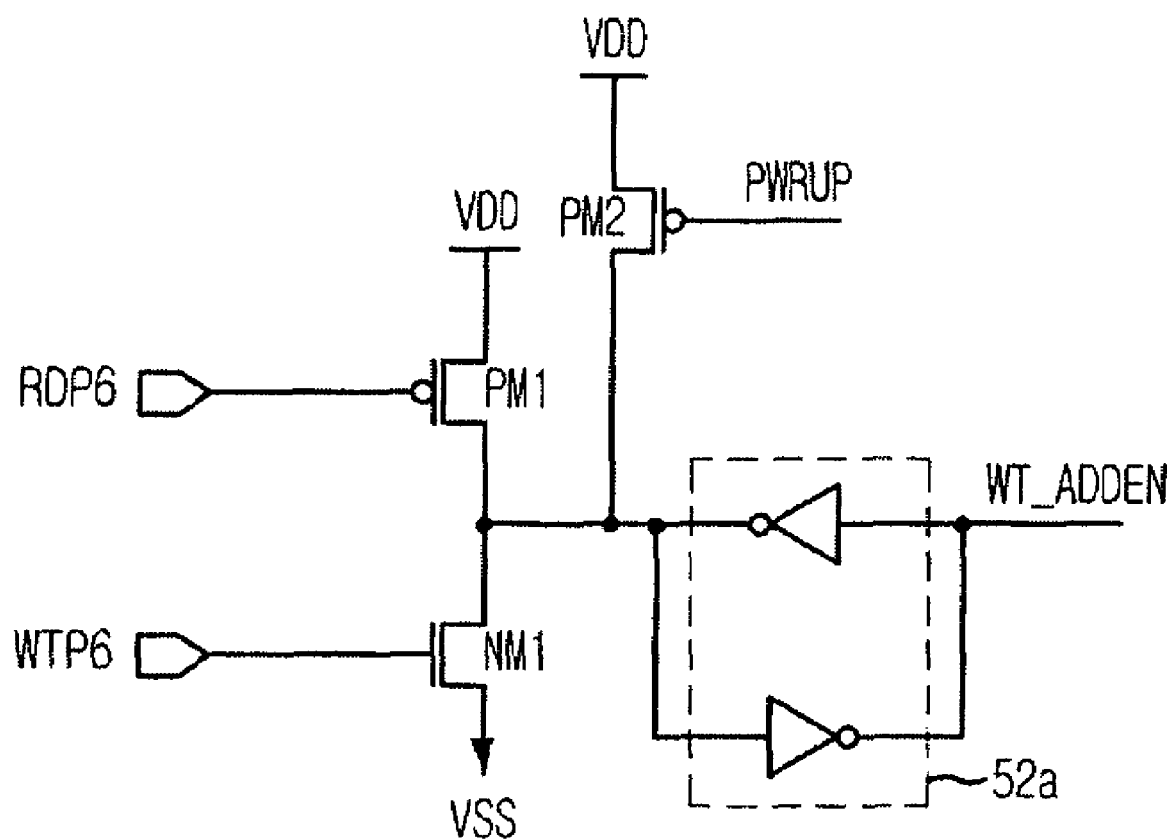
FIG. 3 is a schematic circuit diagram depicting a write section detect unit in the column address shift unit of FIG. 2.
Figure 4:
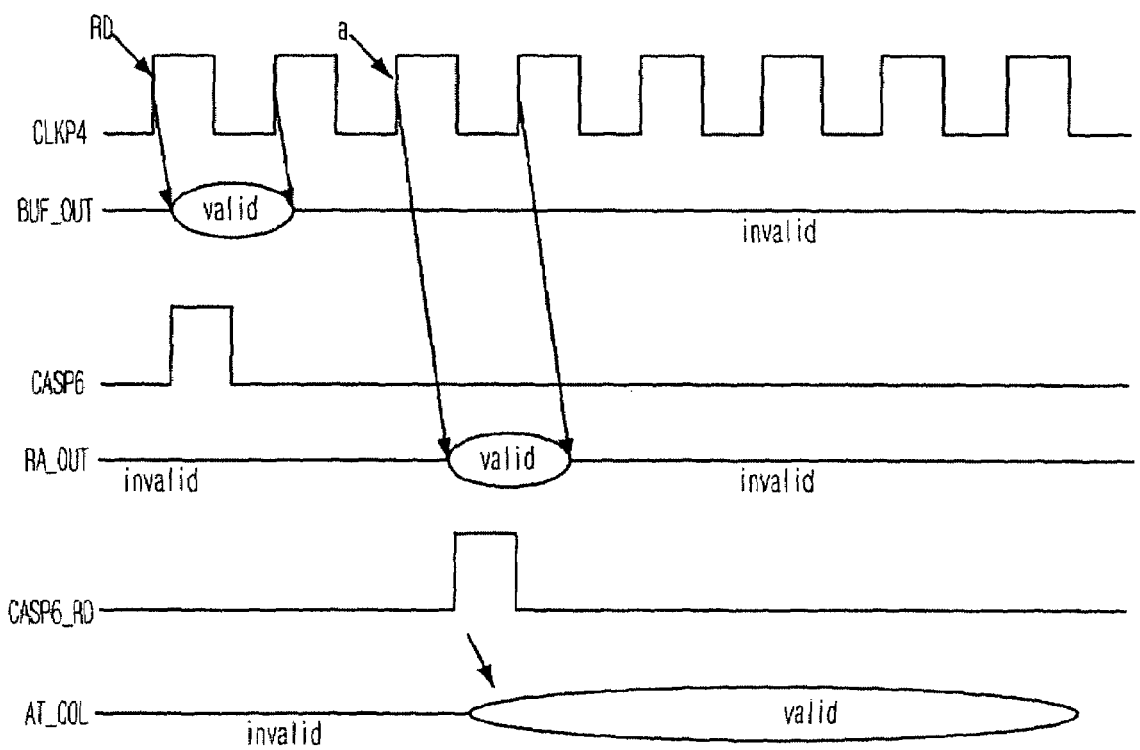
FIG. 4 is a timing diagram illustrating a process to generate an internal column address during a read operation of the conventional semiconductor memory device.
Figure 5:
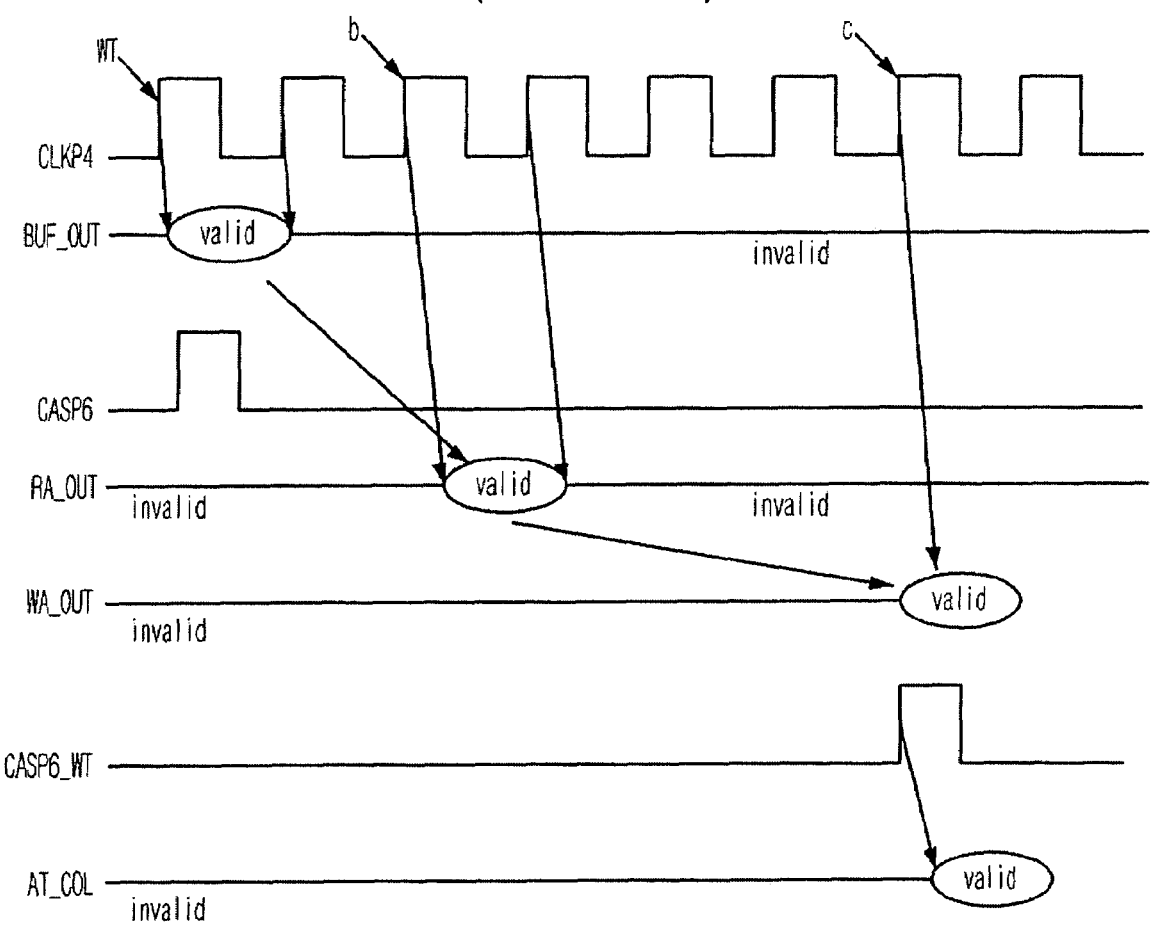
FIG. 5 is a timing diagram illustrating a process to generate an internal column address during a write operation of the conventional semiconductor memory device.
Figure 6:
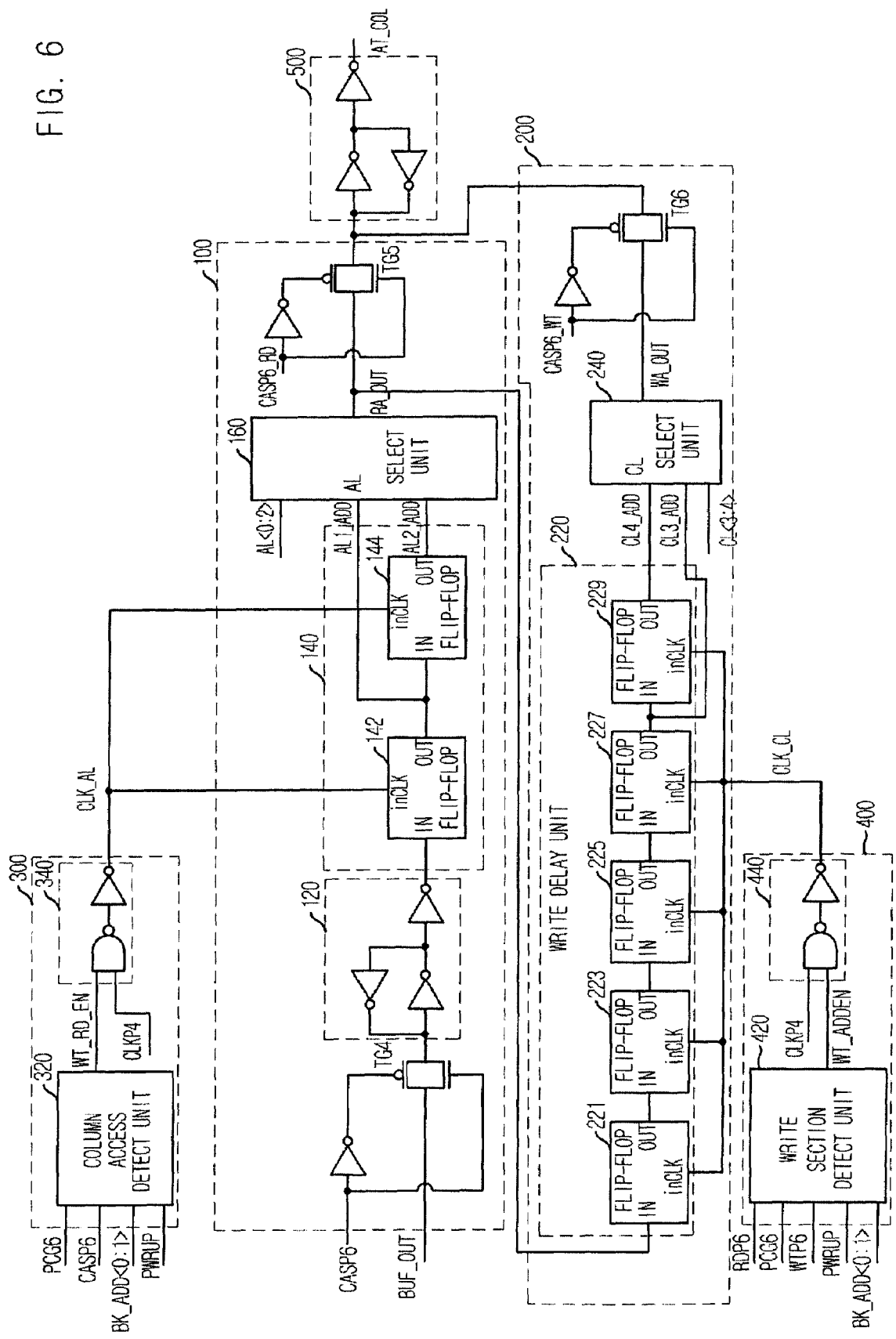
FIG. 6 is a block diagram showing a column address shift unit in a semiconductor memory device in accordance with an embodiment of the present invention.

FIG. 6 is a block diagram showing a column address shift unit in a semiconductor memory device in accordance with an embodiment of the present invention.

As shown, the semiconductor memory device of the present invention includes a read address generating unit 100, a write address generating unit 200, a first driving clock supply unit 300, a second driving clock supply unit 400 and an address output unit 500.

The first driving clock supply unit 300 supplies a first driving clock CLK_AL for the read address generating unit 100 during a read or a write operation in a corresponding bank. The second driving clock supply unit 400 supplies a second driving clock CLK_CL for the write address generating unit 200 during the write operation in the corresponding bank. The read address generating unit 100 generates an AL address RA_OUT in synchronization with the first driving clock CLK_AL by delaying an internal address BUF_OUT inputted in response to a CAS signal CASP6 by an additive latency to thereby output a read address according to a read CAS signal CASP6_RD. The write address generating unit 200 generates a CL address WA_OUT in synchronization with the second driving clock CLK_CL by delaying the AL address RA_OUT by a CAS latency to thereby output a write address according to a write CAS signal CASP6_WT. The address output unit 500 latches the read address or the write address to output the latched address as an internal column address AT_COL.

Herein, the read address generating unit 100, the write address generating unit 200 and the address output unit 500 are served as a delay block for delaying the internal address BUF_OUT by a predetermined latency to output the internal column address AT_COL in response to the first driving clock CLK_AL outputted from the first driving clock supply unit 300 and the second driving clock CLK_CL outputted from the second driving clock supply unit 400.

The first driving clock supply unit 300 includes a column access detect unit 320 and a first output control unit 340.

The column access detect unit 320 receives a first and a second bank address BK_ADD<0:1>, the CAS signal CASP6 and a precharge signal PCG6 to detect the read or the write operation in the corresponding bank. The first output control unit 340 outputs an internal clock CLKP4 as the first driving clock CLK_AL while a column driving signal WT_RD_EN outputted from the column access detect unit 320 is activated.

The second driving clock supply unit 400 includes a write section detect unit 420 and a second output control unit 440.

The write section detect unit 420 receives the first and the second bank address BK_ADD<0:1>, an internal read signal RDP6, an internal write signal WTP6 and the precharge signal PCG6 to detect the write operation in the corresponding bank. The second output control unit 440 outputs the internal clock CLKP4 as the second driving clock CLK_CL while a write section signal WT_ADDEN outputted from the write section detect unit 420 is activated.

The read address generating unit 100 includes a first transfer gate TG4, a read latch unit 120, a read delay unit 140, an AL select unit 160 and a second transfer gate TG5.

The first transfer gate TG4 transfers the internal address BUF_OUT in response to the CAS signal CASP6. The read latch unit 120 latches an output of the first transfer gate TG4. The read delay unit 140 delays an output of the read latch unit 120 to output a first pre-AL address AL1_ADD and a second pre-AL address AL2_ADD. The AL select unit 160 selects one of the first pre-AL address AL1_ADD and the second pre-AL address AL2_ADD in response to an AL information signal AL<0:2> to thereby output the AL address RA_OUT. The second transfer gate TG5 outputs the read address by transferring the AL address RA_OUT in response to the read CAS signal CASP6_RD.

The read delay unit 140 in the read address generating unit 100 includes a first read flip-flop 142 and a second read flip-flop 144 provided in series. The first read flip-flop 142 outputs the first pre-AL address AL1_ADD by synchronizing the output of the read latch unit 120 with the internal clock CLKP4. The second read flip-flop 144 outputs the second pre-AL address AL2_ADD by synchronizing an output of the first read flip-flop 142 with the internal clock CLKP4. Hence, the second pre-AL address AL2_ADD is outputted later than the first pre-AL address AL1_ADD by one clock.

The write address generating unit 200 includes a write delay unit 220, a CL select unit 240 and a third transfer gate TG6.

The write delay unit 220 delays the AL address RA_OUT by the CAS latency to output a first pre-CL address CL3_ADD and a second pre-CL address CL4_ADD. The CL select unit 240 selects one of the first pre-CL address CL3_ADD and the second pre-CL address CL4_ADD in response to a CL information signal CL<3:4> to thereby output the CL address WA_OUT. The third transfer gate TG6 outputs the write address by transferring the CL address WA_OUT in response to the write CAS signal CASP6_WT.

The write delay unit 220 of the write address generating unit 200 includes a first write flip-flop 221 to a fifth write flip-flop 229, provided in series, to generate the first pre-CL address CL3_ADD and the second pre-CL address CL4_ADD by synchronizing the AL address RA_OUT inputted from the read address generating unit 100 with the second driving clock CLK_CL. Hence, a fourth flip-flop 227 outputs the first pre-CL address CL3_ADD by delaying the AL address RA_OUT by three clocks; and the fifth flip-flop 229 outputs the second pre-CL address CL4_ADD by delaying an output of the fourth flip-flop 227 by one clock.

As above described, the first driving clock supply unit 300 and the second driving clock supply unit 400 supply the first driving clock CLK_AL and the second driving clock CLK_CL for the read address generating unit 100 and the write address generating unit 200, respectively, only when the read operation or the write operation in the corresponding bank is performed. Therefore, it is possible to control an activation of a plurality of flip-flops within the read address generating unit 100 and the write address generating unit 200. As a result, an unnecessary current consumption occurred in an idle state or an active state can be reduced.

In the meantime, output nodes of the read address generating unit 100 and the write address generating unit 200 are in common. The read CAS signal CASP6_RD and the write CAS signal CASP6_WT are not activated at a same time so that only one of the read address generating unit 100 and the write address generating unit 200 outputs the read address or the write address in synchronization with the read CAS signal CASP6_RD and the write CAS signal CASP6_WT. As a result, one of the read address or the write address is finally outputted as the internal column address AT_COL through the common output node.

The semiconductor memory device of the present invention detects the read access and the write section by receiving a bank information so as not to generate a wrong internal column address AT_COL. In this regards, a case where the write section detect unit 420 does not receive the bank information is described in FIGS. 7 and 8.

Figure 7:
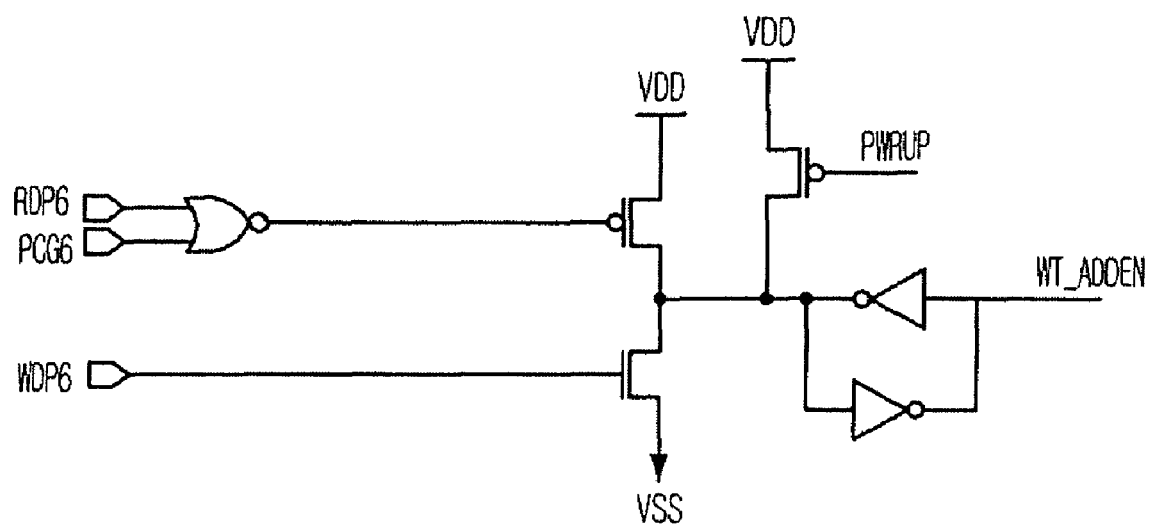
FIG. 7 is a schematic circuit diagram describing a write section detect unit in the column address shift unit of FIG. 6 without bank information.

FIG. 7 is a schematic circuit diagram describing the write section detect unit 420 in the column address shift unit of FIG. 6 without bank information.

As shown, without the bank information, the write section detect unit 420 activates the write section signal WT_AD- DEN when the internal write signal WDP6 is activated. Also, the write section detect unit 420 deactivates the write section signal WT_ADDEN when the internal read signal RDP6 is activated.

Figure 8:
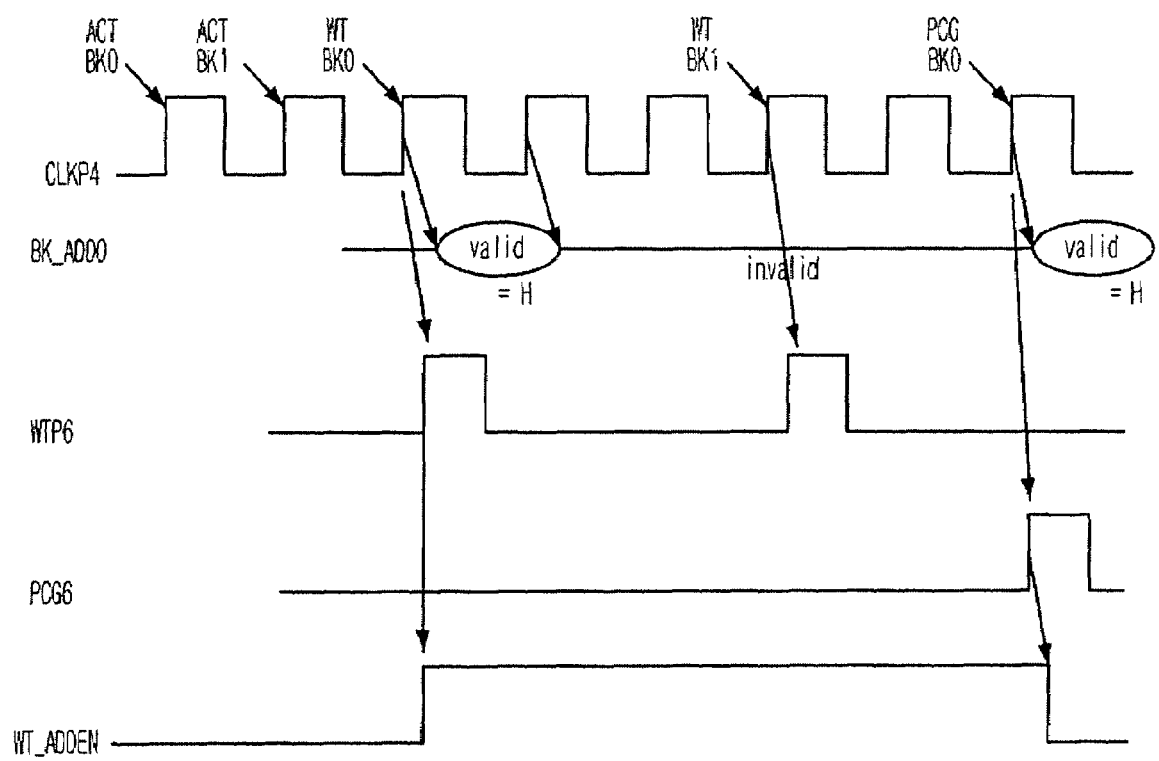
FIG. 8 is a timing diagram illustrating a process to generate an internal column address by the write section detect unit of FIG. 7.

FIG. 8 is a timing diagram illustrating a process to generate the internal column address AT_COL by the write section detect unit 420 of FIG. 7.

As shown, an active command ACT of a first bank BK0 is inputted first; and, then, the active command ACT of a second bank BK1 is inputted in synchronization with the internal clock CLKP4. A write command WT of the first bank BK0 is inputted in synchronization with a next internal clock CLKP4.

The write section detect unit 420 activates the write section signal WT_ADDEN in response to the internal write signal WDP6 activated by the write command WT. As a result, the second driving clock CLK_CL is generated only during an activation of the write section signal WT_ADDEN so that the first write flip-flop 221 to the fifth write flip-flop 229 in the write address generating unit 200 can generate the write address delayed for the CAS latency.

Continuously, the write command WT of the second bank BK1 is inputted so that the internal write signal WDP6 is activated before finishing the write operation in the first bank BK0.

Then, a precharge command PCG of the first bank BK0 is inputted and the precharge signal PCG6 is activated. The write section detect unit 420 deactivates the write section signal WT_ADDEN in response to the precharge signal PCG6 so as not to supply the second driving clock CLK_CL. As a result, the first write flip-flop 221 to the fifth write flip-flop 229 in the write address generating unit 200 do not operate.

Namely, though the write operation in the second bank BK1 is performed, the flip-flops in the write address generating unit 200 do not operate so that the wrong internal column address AT_COL is outputted.

As above described, in case that the write section detect unit 420 only receives the internal write signal WTP6 and the precharge signal PCG6 without the bank information, the wrong internal column address AT_COL can be outputted.

Accordingly, in the present invention, the semiconductor memory device detects the read access and the write section by receiving the bank information to thereby generate the internal column address AT_COL. In this regards, internal structures and operations of each unit are described as follows.

Figure 9:
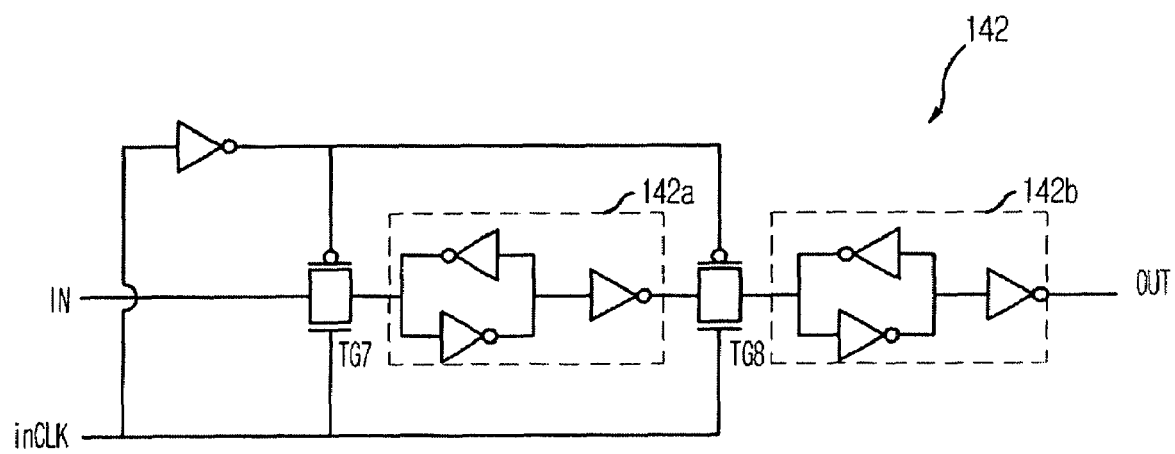
FIG. 9 is a schematic circuit diagram depicting a first read flip-flop in the column address shift unit of FIG. 6.

FIG. 9 is a schematic circuit diagram depicting the first read flip-flop 142 in the column address shift unit of FIG. 6.

As shown, the first read flip-flop 142 includes a fourth transfer gate TG7, a fifth transfer gate TG8, a first latch unit 142a and a second latch unit 142b.

The transfer gate TG7 transfers an input signal IN in response to a logic level 'HIGH' of an input clock inCLK. The first latch unit 142a latches an output of the fourth transfer gate TG7. The fifth transfer gate TG8 transfers an output of the first latch unit 142a in response to the logic level 'HIGH' of the input clock inCLK. The second latch unit 142b latches an output of the fifth transfer gate TG8 to output the latched signal as an output signal OUT.

The first read flip-flop 142 outputs the input signal IN in synchronization with the input clock inCLK. Thus, the output signal OUT is outputted by delaying the input signal IN by one clock in case when the input signal IN is synchronized with the input clock inCLK.

Figure 10:
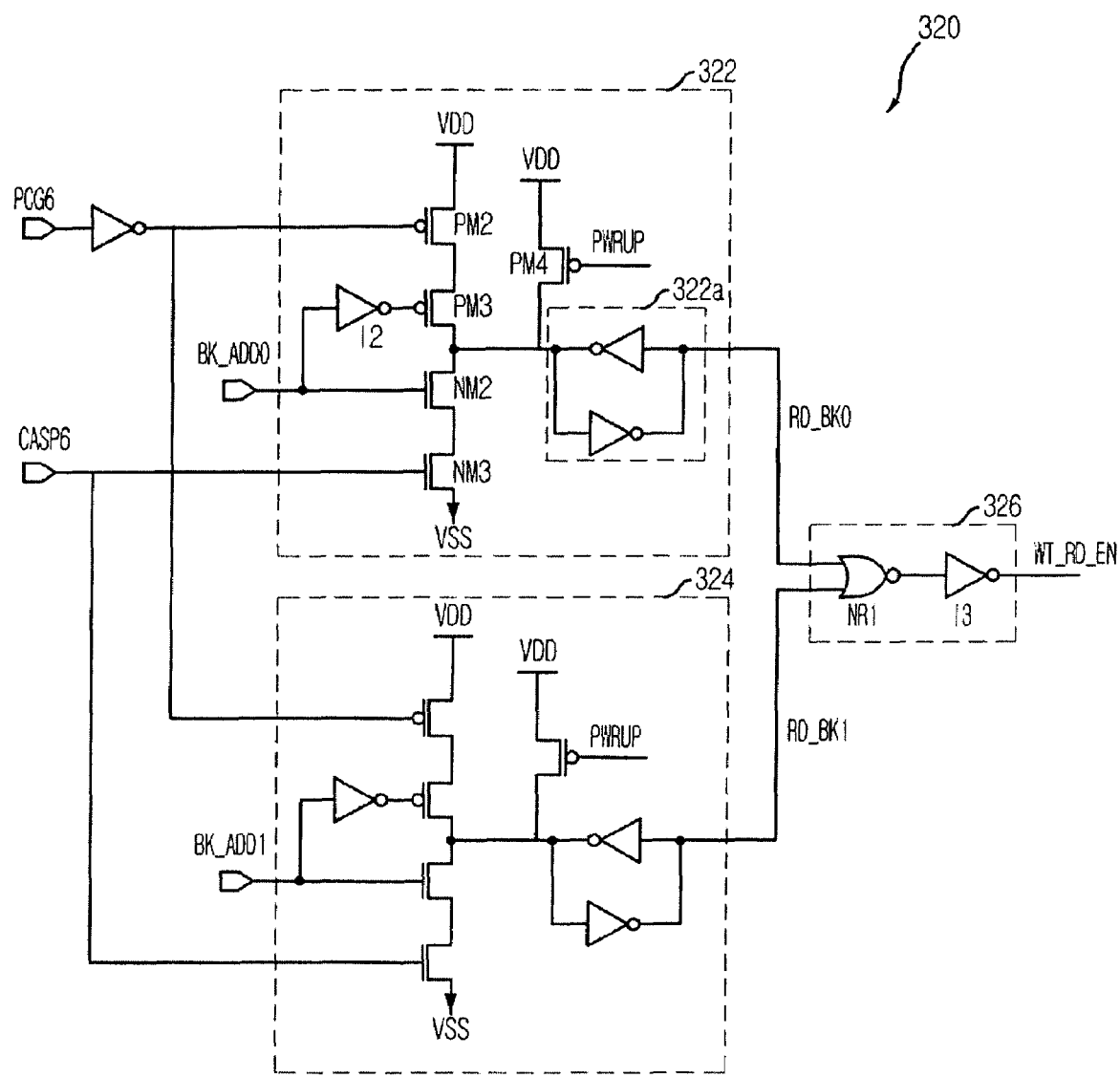
FIG. 10 is a schematic circuit diagram describing a column access detect unit in the column address shift unit of FIG. 6.

FIG. 10 is a schematic circuit diagram describing the column access detect unit 320 in the column address shift unit of FIG. 6.

As shown, the column access detect unit 320 includes a first column access signal generating unit 322, a second column access signal generating unit 324 and a column access signal output unit 326.

The first column access signal generating unit 322 generates a first column access signal RD_BK0 in case of the read or the write operation related with the first bank. The second column access signal generating unit 324 generates a second column access signal RD_BK1 in case of the read or the write operation related with the second bank. The column access signal output unit 326 outputs the column driving signal WT_RD_EN according to the first column access signal RD_BK0 or the second column access signal RD_BK1.

The first column access signal generating unit 322 and the second column access signal generating unit 324 activate the column driving signal WT_RD_EN by detecting a start of the read and the write operation based on an activation of the CAS signal CASP6 inputted together with the first and the second corresponding bank address BK_ADD<0:1>. Also, the first column access signal generating unit 322 and the second column access signal generating unit 324 inactivate the column driving signal WT_RD_EN by detecting an end of the read and the write operation based on an activation of the precharge signal PCG6 inputted together with the corresponding bank address BK_ADD<0:1>.

Namely, the column driving signal WT_RD_EN is continuously activated from a timing of inputting the read command or the write command to the corresponding bank to a timing of inputting the precharge command to the corresponding bank.

The first column access signal generating unit 322 has the same circuit structure to the second column access signal generating unit 324. The first column access signal generating unit 322 is explained as follows.

The first column access signal generating unit 322 includes a first PMOS transistor PM2, a second PMOS transistor PM3, a third PMOS transistor PM4, a first NMOS transistor NM2, a second NMOS transistor NM3, a first inverter I2 and a column access signal latch unit 322a.

The first PMOS transistor PM2 has a gate receiving an inverted precharge signal and a source connected to a first internal voltage VDD supply. The first inverter I2 inverts the first bank address BK_ADD0. The second PMOS transistor PM3 has a gate receiving an output of the first inverter I2 and a source connected to a drain of the first PMOS transistor PM2. The first NMOS transistor NM2 has a gate receiving the first bank address BK_ADD0 and a drain connected to a drain of the second PMOS transistor PM3. The second NMOS transistor MN3 has a gate receiving the CAS signal CASP6 and a drain-source path between the first NMOS transistor NM2 and a second internal voltage VSS supply. The third PMOS transistor PM4 has a gate receiving a power-up signal PWRUP and a source-drain path between the first internal voltage VDD supply and the second PMOS transistor PM3. The column access signal latch unit 322a latches a signal supplied at a connecting node between the second PMOS transistor PM3 and the first NMOS transistor NM2 to output the first column access signal RD_BK0.

In detail, the column access signal output unit 326 includes a first NOR gate NR1 and a second inverter I3. The first NOR gate NR1 receives the first column access signal RD_BK0 and the second column access signal RD_BK1.

The second inverter I3 inverts an output of the first NOR gate NR1 to output the inverted signal as the column driving signal WT_RD_EN.

Figure 11:
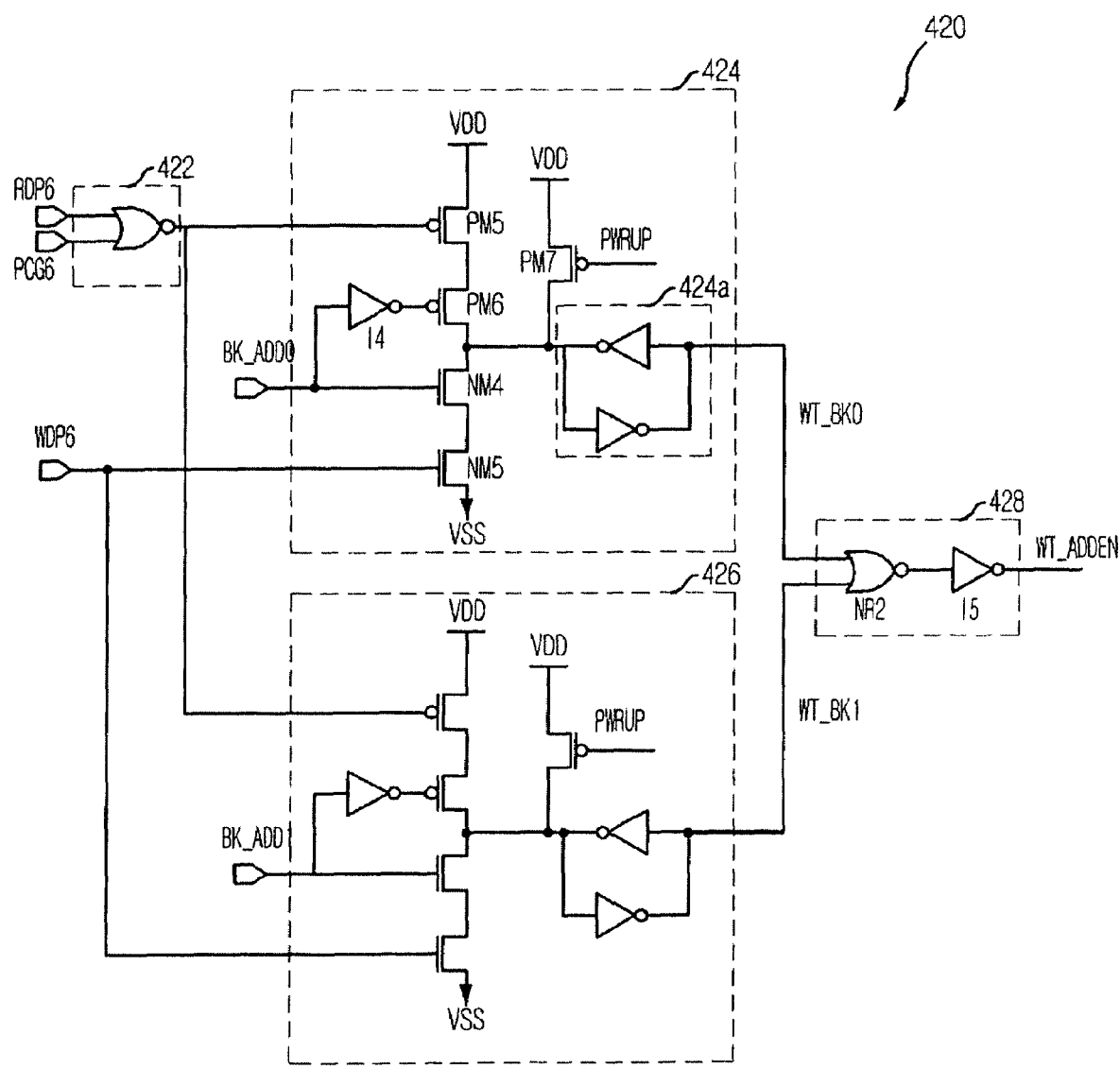
FIG. 11 is a schematic circuit diagram depicting a write section detect unit in the column address shift unit of FIG. 6.

FIG. 11 is a schematic circuit diagram depicting the write section detect unit 420 in the column address shift unit of FIG. 6.

As shown, the write section detect unit 420 includes an off-driving control unit 422, a first write section signal generating unit 424, a second write section signal generating unit 426, and a write section signal output unit 428.

The off-driving control unit 422 activates an off-driving signal if the internal read signal RDP6 or the precharge signal PCG6 is activated. The first write section signal generating unit 424 detects the write operation of the first bank to generate a first bank write section signal WT_BK0. The second write section signal generating unit 426 detects the write operation of the second bank to generate a second bank write section signal WT_BK1. The write section signal output unit 428 outputs the write section signal WT_ADDEN in response to the first bank write section signal WT_BK0 and the second bank write section signal WT_BK1.

The write section detect unit 420 activates the write section signal WT_ADDEN by detecting the write operation of the corresponding bank until the internal read signal RDP6 or the precharge signal PCG6 is activated.

The first write section signal generating unit 424 has the same circuit structure to the second write section signal generating unit 426. The first write section signal generating unit 424 is explained as follows.

The first write section signal generating unit 424 includes a fourth PMOS transistor PM5, a fifth PMOS transistor PM6, a sixth PMOS transistor PM7, a third NMOS transistor NM4, a fourth NMOS transistor NM5, a third inverter I4 and a write section signal latch unit 424a.

The fourth PMOS transistor PM5 has a gate receiving the off-driving signal and a source connected to a first internal voltage VDD supply. The third inverter I4 inverts the first bank address BK_ADD0. The fifth PMOS transistor PM6 has a gate receiving an output of the third inverter I4 and a source connected to a drain of the fourth PMOS transistor PM5. The third NMOS transistor NM4 has a gate receiving the first bank address BK_ADD0 and a drain connected to a drain of the fifth PMOS transistor PM6. The fourth NMOS transistor NM5 has a gate receiving the internal write signal WDP6 and a drain-source path between the third NMOS transistor NM4 and a second internal voltage VSS supply. The sixth PMOS transistor PM7 has a gate receiving the power-up signal PWRUP and a source-drain path between the first internal voltage VDD supply and the fifth PMOS transistor PM6. The write section signal latch unit 424a latches a signal supplied at a connecting node between the fifth PMOS transistor PM6 and the third NMOS transistor NM4 to output the latched signal as the first bank write section signal WT_BK0.

The write section signal output unit 428 includes a second NOR gate NR2 and a fourth inverter I5. The second NOR gate NR2 receives the first bank write section signal WT_BK0 and the second bank write section signal WT_BK1. The second fourth inverter I5 inverts an output of the second NOR gate NR2 to output the write section signal WT_ADDEN.

The read or the write operation of the semiconductor memory device of the present invention is described hereinafter, referring to FIGS. 12 and 13.

Figure 12:
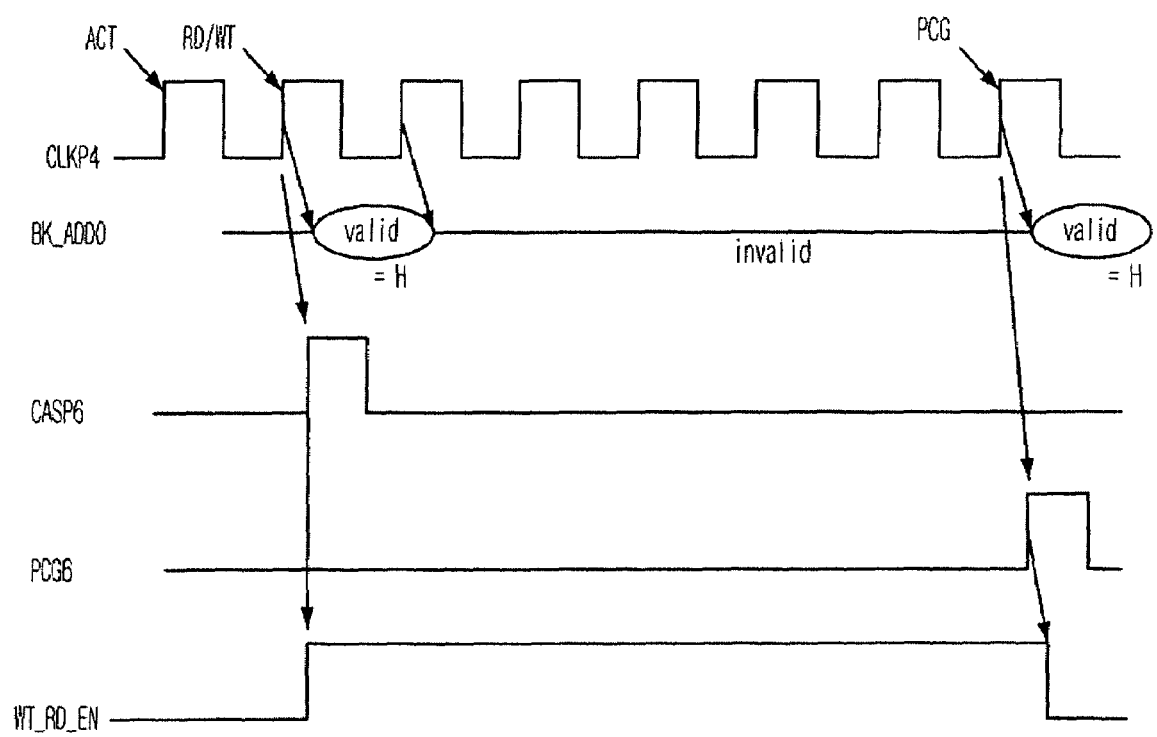
FIG. 12 is a timing diagram illustrating a process to generate an internal column address during a read operation of the semiconductor memory device.

FIG. 12 is a timing diagram illustrating a process to generate the internal column address AT_COL during the read operation of the semiconductor memory device in accordance with an embodiment of the present invention.

As shown, after the active command ACT is inputted, the read command RD is inputted in synchronization with the internal clock CLKP4. The CAS signal CASP6 is activated according to the read command RD, and the internal address BUF_OUT has an effective address information.

The column access detect unit 320 within the first driving clock supply unit 300 activates the column driving signal WT_RD_EN in response to the CAS signal CASP6. As a result, the first output control unit 340 outputs the internal clock CLKP4 as the first driving clock CLK_AL while the column driving signal WT_RD_EN is activated.

The read address generating unit 100 receives the internal address BUF_OUT in response to the CAS signal CASP6 and delays the internal address BUF_OUT by the additive latency to thereby output the internal column address AT_COL in synchronization with the read CAS signal CASP6_RD.

At this time, the first read flip-flop 142 and the second read flip-flop 144 within the read delay unit 140 of the read address generating unit 100 are operated by the first driving clock CLK_AL.

If the first driving clock supply unit 300 does not supply the first driving clock CLK_AL by inactivating the column driving signal WT_RD_EN according to the precharge signal PCG6, the first read flip-flop 142 and the second read flip-flop 144 within the read delay unit 140 can not operate.

As above described, the semiconductor memory device of the present invention generates the column driving signal WT_RD_EN indicating the read operation or the write operation to thereby supply the first driving clock CLK_AL only during an activation of the column driving signal WT_RD_EN. Therefore, the first read flip-flop 142 and the second read flip-flop 144, which delays the internal address BUF_OUT for the additive latency, are operated only during the activation of the column driving signal WT_RD_EN. As a result, it is possible to reduce the unnecessary current consumption occurred in an idle state or a bank active state when it is not required to generate the internal column address AT_COL.

In particularly, in the conventional semiconductor memory device, the wrong internal column address AT_COL is generated because a new command is inputted before a prior command has been finished. On the other hand, the semiconductor memory device of the present invention divides the read operation or the write operation of each bank by using the first and the second bank address BK_ADD<0:1> so as to continuously activate the column driving signal WT_RD_EN until the precharge command PCG6 is inputted. As a result, it is possible to prevent the wrong internal column address AT_COL from being generated.

Figure 13:
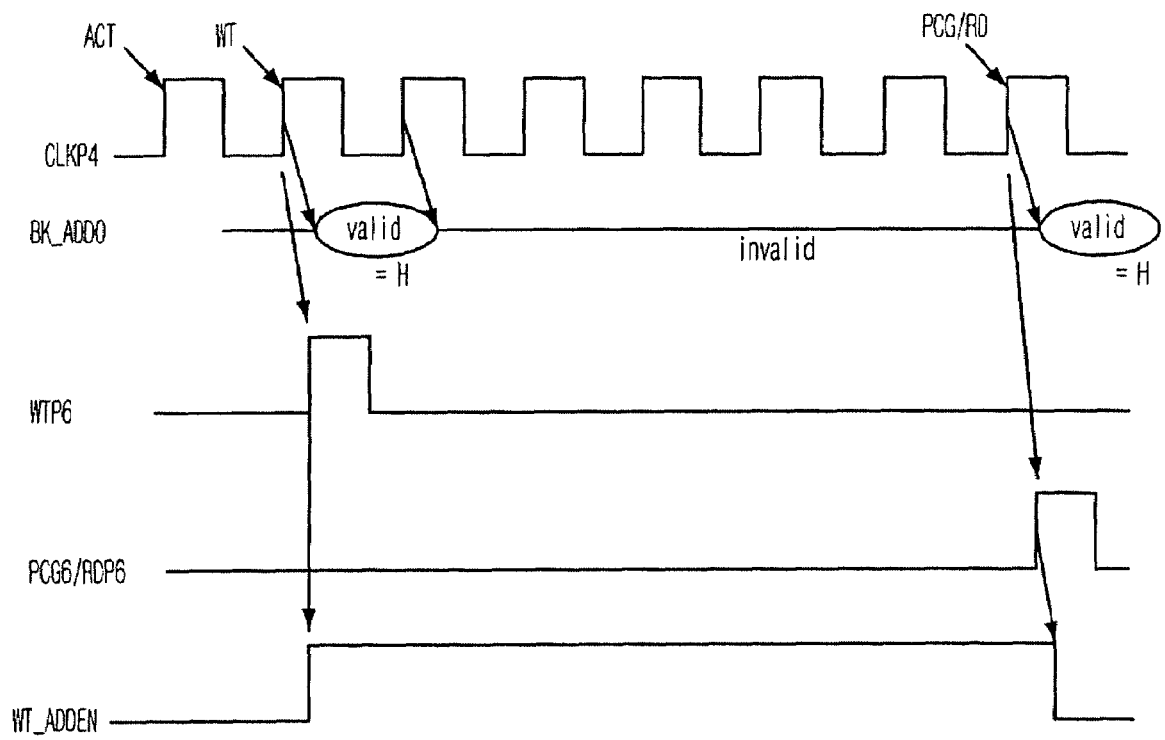
FIG. 13 is a timing diagram illustrating a process to generate an internal column address during a write operation of the semiconductor memory device.

FIG. 13 is a timing diagram illustrating a process to generate the internal column address AT_COL during the write operation of the semiconductor memory device in accordance with an embodiment of the present invention.

As shown, after the active command ACT is inputted, the write command WT is inputted in synchronization with the internal clock CLKP4. The CAS signal CASP6 and the internal write signal WTP6 are activated according to the write command WT, and the internal address BUF_OUT has an effective address information.

The first driving clock supply unit 300 activates the column driving signal WT_RD_EN in response to the CAS signal CASP6 and the first and the second bank address signal BK_ADD<0:1>. As a result, the first driving clock supply unit 300 outputs the internal clock CLKP4 as the first driving clock CLK_AL while the column driving signal WT_RD_EN is activated.

The second driving clock supply unit 400 activates the write section signal WT_ADDEN in response to the internal write signal WTP6 and the first and the second bank address signal BK_ADD<0:1>. As a result, the second driving clock supply unit 400 outputs the internal clock CLKP4 as the second driving clock CLK_CL while the write section signal WT_ADDEN is activated.

The read address generating unit 100 receives the internal address BUF_OUT in response to the CAS signal CASP6 and delays the internal address BUF_OUT by the additive latency to thereby output the AL address RA_OUT. At this time, the first read flip-flop 142 and the second read flip-flop 144 within the read delay unit 140 operate according to the first driving clock CLK_AL.

The write address generating unit 200 outputs the write address in synchronization with write CAS signal CASP6_WT by delaying the AL address RA_OUT by the CAS latency through the first write flip-flop 221 to the fifth write flip-flop 229. The address output unit 500 latches the write address to output the latched signal as the internal column address AT_COL.

At this time, the first read flip-flop 142 and the second read flip-flop 144 within the read delay unit 140 are operated by the first driving clock CLK_AL, and the first write flip-flop 221 to the fifth write flip-flop 229 are operated by the second driving clock CLK_CL.

If the precharge signal PCG6 is activated by the precharge command PCG, the first driving clock supply unit 300 deactivates the column driving signal WT_RD_EN so as not to supply the first driving clock CLK_AL. The second driving clock supply unit 400 also deactivates the write section signal WT_ADDEN so as not to supply the second driving clock CLK_CL. Hence, the flip-flops within the first driving clock supply unit 300 and the second driving clock supply unit 400 do not operate.

As described above, the semiconductor memory device of the present invention generates the write section signal WT_ADDEN only activated during the write operation to thereby supply the second driving clock CLK_CL. Therefore, the first write flip-flop 221 to the fifth write flip-flop 229, which delays the AL address RA_OUT by the CAS latency, are operated only during the active section of the write section signal WT_ADDEN. As a result, it is possible to reduce the unnecessary current consumption occurred in an idle state or a bank active state when it is not required to generate the internal column address AT_COL.

In the aforesaid present invention, a case when the semiconductor memory device provides the first bank and the second bank has been explained as an example. However, a concept of the present invention for generating the internal column address only during the read operation or the write operation can not be restricted.

The present application contains subject matter related to the Korean patent application No. KR 2005-36594, filed in the Korean Patent Office on Apr. 30, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A semiconductor memory device, comprising:
   a driving clock supply unit for supplying a driving clock during an operation with respect to a memory; and
   a delay unit for generating a delayed address in synchronization with the driving clock by delaying an address by a predetermined time based on one of a first latency, a second latency and a combination thereof,
   wherein the driving clock supply unit includes;
   a first driving clock supply unit for supplying a first driving clock for the delay unit during a read or a write operation with respect to each memory bank; and
   a second driving clock supply unit for supplying a second driving clock for the delay unit during a write operation with respect to each memory bank.

2. The semiconductor memory device as recited in claim 1, further comprising an output unit for latching the delayed address to output the latched signal as an internal column address.

3. The semiconductor memory device as recited in claim 2, wherein the address is an internal address inputted from outside of the memory device.

4. The semiconductor memory device as recited in claim 1, wherein the operation is a read operation; and
   the address is a read address.

5. The semiconductor memory device as recited in claim 1, wherein the operation is a write operation; and
   the address is a write address.

6. The semiconductor memory device as recited in claim 1, wherein the first latency is an additive latency.

7. The semiconductor memory device as recited in claim 6, wherein the second latency is a CAS latency.

8. The semiconductor memory device as recited in claim 7, wherein the delay unit includes:
   a read address generating unit including a plurality of flip-flops operated in synchronization with the first driving clock for generating an AL address by delaying the address inputted in response to a CAS signal by the additive latency to thereby output the read address according to a read CAS signal; and
   a write address generating unit including a plurality of flip-flops operated in synchronization with the second driving clock for generating a CL address by delaying the AL address by the CAS latency to thereby output the write address according to a read CAS signal.

9. The semiconductor memory device as recited in claim 8, wherein the first driving clock supply unit includes:
   a column access detect unit for receiving a bank address, the CAS signal and a precharge signal to detect the read or the write operation of the bank; and
   a first output control unit for outputting the first driving clock generated from an internal clock while a column driving signal of the column access detect unit is activated.

10. The semiconductor memory device as recited in claim 9, wherein the second driving clock supply unit includes:
    a write section detect unit for receiving a bank address, an internal read signal, an internal write signal and the precharge signal to detect the write operation of the bank; and
    a second output control unit for outputting the second driving clock generated from the internal clock while a write section signal of the write section detect unit is activated.

11. The semiconductor memory device as recited in claim 10, wherein the CAS signal is activated when the internal read signal or the internal write signal is activated.

12. The semiconductor memory device as recited in claim 11, wherein the column access detect unit includes:
a plurality of bank column access signal generating units, each of which for generating a bank column access signal in case of a read or a write operation related with the bank; and
a column access signal output unit for outputting the column driving signal based on the bank column access signal,
wherein the number of bank column access signal generating units corresponds to the number of banks in the semiconductor memory device.

13. The semiconductor memory device as recited in claim 10, wherein each bank column access signal generating unit includes:
a first PMOS transistor having a gate receiving an inverted precharge signal and a source connected to a first internal voltage supply;
a first inverter for inverting a bank address;
a second PMOS transistor having a gate receiving an output of the first inverter and a source connected to a drain of the first PMOS transistor;
a first NMOS transistor having a gate receiving each bank address and a drain connected to a drain of the second PMOS transistor;
a second NMOS transistor having a gate receiving the CAS signal and a drain-source path between the first NMOS transistor and a second internal voltage supply;
a third PMOS transistor having a gate receiving a power-up signal and a source-drain path between the first internal voltage supply and the second PMOS transistor; and
a column access signal latch unit for latching a voltage of a connecting node between the second PMOS transistor and the first NMOS transistor to output the latched signal as the first column access signal.

14. The semiconductor memory device as recited in claim 13, wherein the column access signal output unit includes:
a first NOR gate for receiving one or more bank column access signals; and
a second inverter for inverting an output of the first NOR gate to output the inverted signal as the column driving signal.

15. The semiconductor memory device as recited in claim 12, wherein the write section detect unit includes:
an off-driving control unit for activating an off-driving signal if the internal read signal or the precharge signal is activated;
a plurality of bank write section signal generating units, each of which for detecting a write operation with respect to a bank to generate a bank write section signal; and
a write section signal output unit for outputting the write section signal in response to the bank write section signal,
wherein the number of bank write section signal generating units corresponds to the number of banks in the semiconductor memory device.

16. The semiconductor memory device as recited in claim 15, wherein each bank write section signal generating unit includes:
a first PMOS transistor having a gate receiving the off-driving signal and a source connected to a first internal voltage supply;
a first inverter for inverting a bank address;
a second PMOS transistor having a gate receiving an output of the first inverter and a source connected to a drain of the first PMOS transistor;
a first NMOS transistor having a gate receiving each bank address and a drain connected to a drain of the second PMOS transistor;
a second NMOS transistor having a gate receiving the internal write signal and a drain-source path between the first NMOS transistor and a second internal voltage supply;
a third PMOS transistor having a gate receiving a power-up signal and a source-drain path between the first internal voltage supply and the second PMOS transistor; and
a write section signal latch unit for latching a voltage of a connecting node between the second PMOS transistor and the first NMOS transistor to output the latched signal as a bank write section signal.

17. The semiconductor memory device as recited in claim 16, wherein the write section signal output unit includes:
a first NOR gate for receiving each bank write section signal; and
a second inverter for inverting an output of the first NOR gate to output the inverted signal as the write section signal.

18. The semiconductor memory device as recited in claim 15, wherein the read address generating unit includes:
a first transfer gate for transferring the address in response to the CAS signal;
a read latch unit for latching an output of the first transfer gate;
a read delay unit for delaying an output of the read latch unit to output a first pre-AL address in response to an AL information signal to thereby signal to thereby output the selected address as the AL address; and
a second transfer gate for outputting the read address by transferring the AL address in response to the read CAS signal.

19. The semiconductor memory device as recited in claim 18, wherein the read delay unit includes a plurality of flip-flops in series to synchronize the output of the read latch unit with the first driving clock to thereby output the first pre-AL address and the second pre-AL address.

20. The semiconductor memory device as recited in claim 19, wherein the flip-flop includes:
a fourth transfer gate for transferring an input signal in response to an input clock;
a first latch unit for latching an output of the fourth transfer gate;
a fifth transfer gate for transferring an output of the first latch unit in response to an input clock; and
a second latch for latching an output of the fifth transfer gate.

21. The semiconductor memory device as recited in claim 18, wherein the write address generating unit includes:
a write delay unit for delaying the AL address by the CAS latency to output a first pre-CL address and a second pre-CL address;
a CL select unit for selecting one of the first pre-CL address and the second pre-CL address in response to a CL information signal to thereby output the CL address; and
a third transfer gate for outputting the write address by transferring the CL address in response to the write CAS signal.

22. The semiconductor memory device as recited in claim 21, wherein the write delay unit includes a plurality of flip-flops in series to synchronize the output of the write latch unit with the second driving clock to thereby output the first pre-CL address and the second pre-CL address.

23. The semiconductor memory device as recited in claim 22, wherein the flip-flop includes:
- a fourth transfer gate for transferring an input signal in response to an input clock;
- a first latch unit for latching an output of the fourth transfer gate;
- a fifth transfer gate for transferring an output of the first latch unit in response to an input clock; and
- a second latch for latching an output of the fifth transfer gate.

24. The semiconductor memory device, comprising:
- a first drying clock supply unit for supplying a first driving clock during a read or a write operation with respect to a bank;
- a second driving clock supply unit for supplying a second driving clock during the write operation with respect to a bank;
- a read address generating unit for generating an AL address in synchronization with the first driving clock by delaying an address by a first latency to thereby output a read address according to a read CAS signal;
- a write address generating unit for generating a CL address in synchronization with the second driving clock by delaying the AL address by a second latency to thereby output a write address according to a write CAS signal; and
- an address output unit for latching the read address or the write address to output the latched signal as an internal column address.

25. The semiconductor memory device as recited in claim 24, wherein the first latency is an additive latency.

26. The semiconductor memory device as recited in claim 25, wherein the second latency is a CAS latency.

27. The semiconductor memory device as recited in claim 26, wherein the address is an internal address inputted from outside of the memory device.

28. The semiconductor memory device as recited in claim 26, wherein the first driving clock supply unit includes:
- a column access detect unit for receiving a bank address, a CAS signal and a precharge signal to detect a read or a write operation of the bank; and
- a first output control unit for outputting the first driving clock generated from an internal clock while a column driving signal of the column access detect unit is activated.

29. The semiconductor memory device as recited in claim 28, wherein the second driving clock supply unit includes:
- a write section detect unit for receiving a bank address, an internal read signal, an internal write signal and the precharge signal to a write operation of the bank; and
- a second output control unit for outputting the second driving clock generated from the internal clock while a write section signal of the write section detect unit is activated.

30. The semiconductor memory device as recited in claim 29, wherein the CAS signal is activated when the internal read signal or the internal write signal is activated.

* * * * *